US008878080B2

(12) United States Patent
Judy et al.

(10) Patent No.: US 8,878,080 B2
(45) Date of Patent: *Nov. 4, 2014

(54) PORTABLE ELECTROMAGNETIC INTERFERENCE SHIELD

(75) Inventors: Ryan Judy, Santa Barbara, CA (US); Deniz Armani, Pasadena, CA (US)

(73) Assignee: E.C. Ryan International, Inc., Santa Barbara, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 13/471,246

(22) Filed: May 14, 2012

(65) Prior Publication Data

US 2012/0285737 A1  Nov. 15, 2012

Related U.S. Application Data

(60) Provisional application No. 61/486,124, filed on May 13, 2011.

(51) Int. Cl.
*H05K 9/00* (2006.01)
(52) U.S. Cl.
CPC .................................... *H05K 9/0043* (2013.01)
USPC ............ 174/378; 174/382; 174/386; 206/720
(58) Field of Classification Search
USPC .......... 174/377, 382, 378, 386; 361/816, 818; 206/720
See application file for complete search history.

(56) References Cited

U.S. PATENT DOCUMENTS

| 4,658,958 | A | 4/1987 | McNulty et al. |
| 5,136,119 | A | 8/1992 | Leyland |
| 5,436,803 | A * | 7/1995 | Annis et al. .................... 361/818 |
| 5,594,200 | A | 1/1997 | Ramsey |
| 5,791,485 | A | 8/1998 | Carbonneau |
| 5,981,103 | A | 11/1999 | Batten, Jr. et al. |
| 6,657,214 | B1 * | 12/2003 | Foegelle et al. ............ 250/506.1 |
| 7,075,798 | B2 | 7/2006 | Hendrickson |
| 7,601,921 | B2 | 10/2009 | Schroader |
| 8,294,044 | B2 | 10/2012 | Ramsey |
| 2003/0057131 | A1 | 3/2003 | Diaferia |
| 2005/0118366 | A1 | 6/2005 | Piemonte et al. |
| 2006/0037156 | A1 | 2/2006 | VanHulzen |
| 2006/0044206 | A1 | 3/2006 | Moskowitz et al. |
| 2006/0254815 | A1 | 11/2006 | Humphrey et al. |
| 2007/0034406 | A1 | 2/2007 | Schroader |
| 2007/0142103 | A1 | 6/2007 | Livine |
| 2008/0268924 | A1 † | 10/2008 | Chang |
| 2010/0270070 | A1 † | 10/2010 | Bradley |
| 2012/0228020 | A1 | 9/2012 | Winch et al. |

FOREIGN PATENT DOCUMENTS

| DE | 3638123 | * | 5/1988 | ............... H05K 9/00 |
| JP | 03011726 | | 1/1991 | |
| WO | WO 2007/110653 | * | 10/2007 | ............... H05K 9/00 |
| WO | WO 2008/134753 | | 11/2009 | |

* cited by examiner
† cited by third party

*Primary Examiner* — Hung Ngo
(74) *Attorney, Agent, or Firm* — Cislo & Thomas, LLP

(57) ABSTRACT

An electromagnetic interference shield enclosure with an extended edge defining a sleeve, the enclosure and sleeve having an outer protective layer and an inner shielding layer to shield electronic devices from electromagnetic interference. The outer layer and inner layer may be transparent to view the electronic device. A magnet system may be provided to allow the device to be operated while in the enclosure. The auxiliary cable with filtering mechanisms may be provided inside the sleeve to allow access and transfer of data from the electronic device while still in the enclosure.

18 Claims, 10 Drawing Sheets

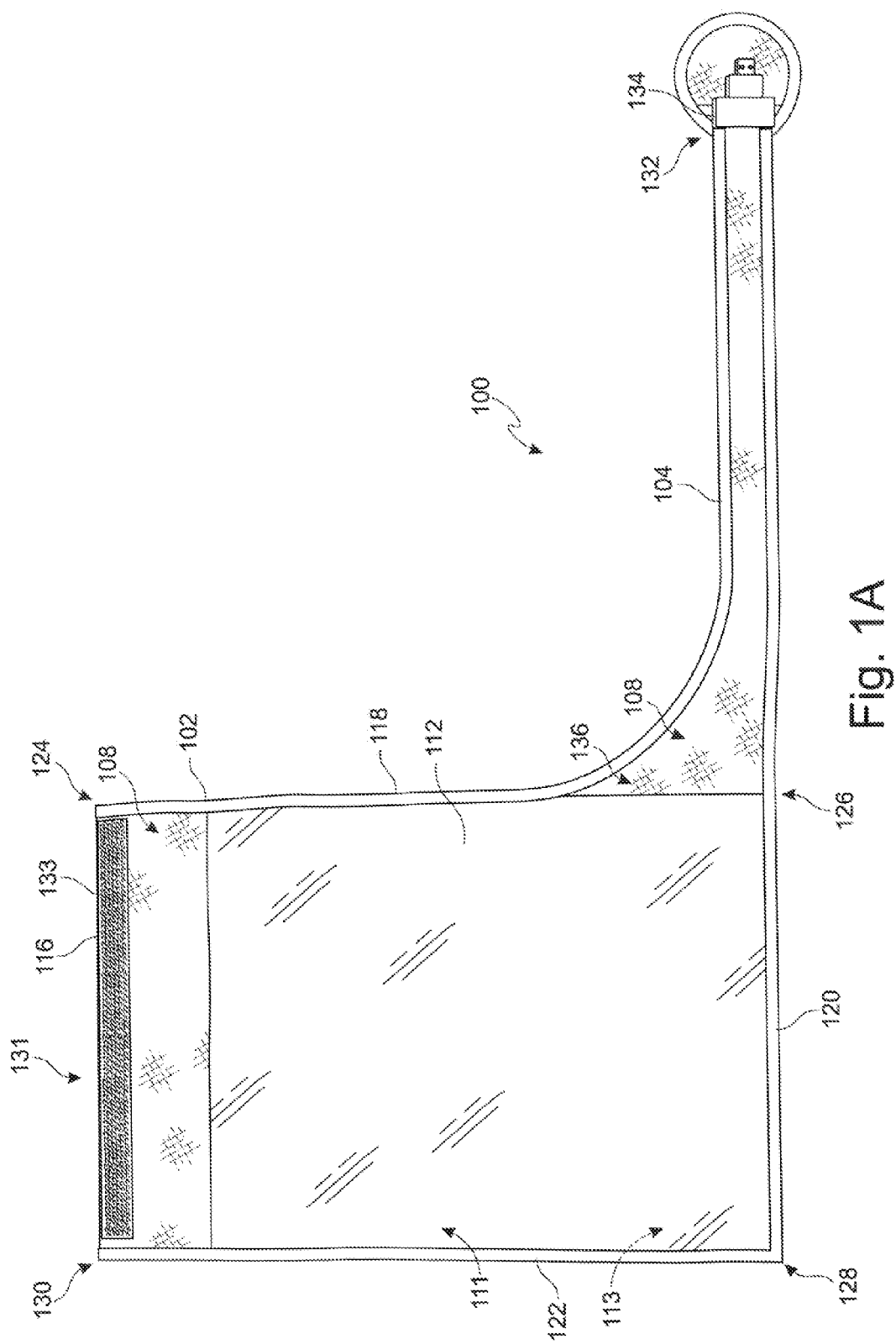

PORTABLE ELECTROMAGNETIC INTERFERENCE SHIELD

CROSS-REFERENCE TO RELATED APPLICATION

This patent application claims the benefit of U.S. Provisional Patent Application No. 61/486,124, entitled "Portable EMI Shield," filed May 13, 2011, which application is incorporated in its entirety here by this reference.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This invention relates generally to electromagnetic interference (EMI) enclosures, and more specifically relates to portable EMI enclosures for use in shielding electronics from EMI and wireless communication signals.

BACKGROUND ART

EMI shields are useful for many purposes, specifically for protecting forensic evidence. If a portable wireless device is taken from its owner it is important to ensure that the data on the device is not altered in any way from the point of seizure. One method of ensuring this is to shield the device from incoming or outgoing wireless signals using a portable EMI enclosure. It is often desirable to access the device inside of the EMI enclosure to forensically analyze the data it contains while keeping the evidence shielded from EMI signals. It may also be desirable to charge the device while inside of the EMI enclosure.

Prior to this invention, portable EMI enclosures did not provide a method for maintaining EMI shielding while accessing the device inside via cable for either data acquisition, charging, or both. Thus, there is a need for a method of accessing and connecting to a portable wireless device via cable while it is inside of a portable EMI enclosure, without compromising the shielding.

It is also desirable, or sometimes necessary, to manually operate a device inside of a portable EMI enclosure. Portable wireless devices with touchscreens are particularly problematic to operate inside of portable EMI enclosures. Thus, there is also a need for a method of operating portable wireless devices with touchscreens inside of portable EMI enclosures.

Portable EMI shields that allow one to preview devices contained therein shield EMI signals less effectively than portable EMI enclosures that do not allow one to preview the devices contained inside. This is most often noticed when transporting wireless devices inside of EMI enclosures. The reason why this is most often noticed during transport is because it is at this time that a portable wireless device could come close to a signal tower. The closer a wireless device is to a signal tower, the better chance it will have of connecting with the signal from that tower, rendering the EMI enclosure useless.

EMI enclosures that allow access to a device within the enclosure and shield signals effectively exist but they are not portable. They are heavy, metal-lined enclosures as in U.S. Pat. No. 5,594,200 to Ramsey.

Many prior art portable EMI enclosures do not allow cable access to a device inside without compromising their shielding. When operated correctly, they are bags that become a sealed container as in U.S. Pat. No. 7,601,921 to Shroader.

Also, prior art portable EMI enclosures do not allow a human to operate a touchscreen device inside, and prior art portable EMI enclosures that allow a preview of devices inside shield less effectively than portable EMI enclosures that do not allow preview.

DISCLOSURE OF INVENTION

The present invention relates to an EMI shield comprised of an EMI enclosure having an outer, protective layer and an inner, shielding layer that allows the device to be operated and accessed so as to extract data without compromising the shielding of the device. In some embodiments, the EMI shield may comprise a shielded sleeve having a cable to connect the device to external devices. In some embodiments, the EMI shield may have transparent windows so that the device can be seen through the shield. The magnet system may be used to operate the device through the transparent windows. In some embodiments, supports may be used to protect the device inside the shield while keeping the protective layer off of the device. In some embodiments, a secondary EMI enclosure may also be included.

BRIEF DESCRIPTION OF DRAWINGS

FIG. 1A is a perspective view of an embodiment of the EMI shield according to the present invention.

BEST MODE FOR CARRYING OUT THE INVENTION

Figure 1B:
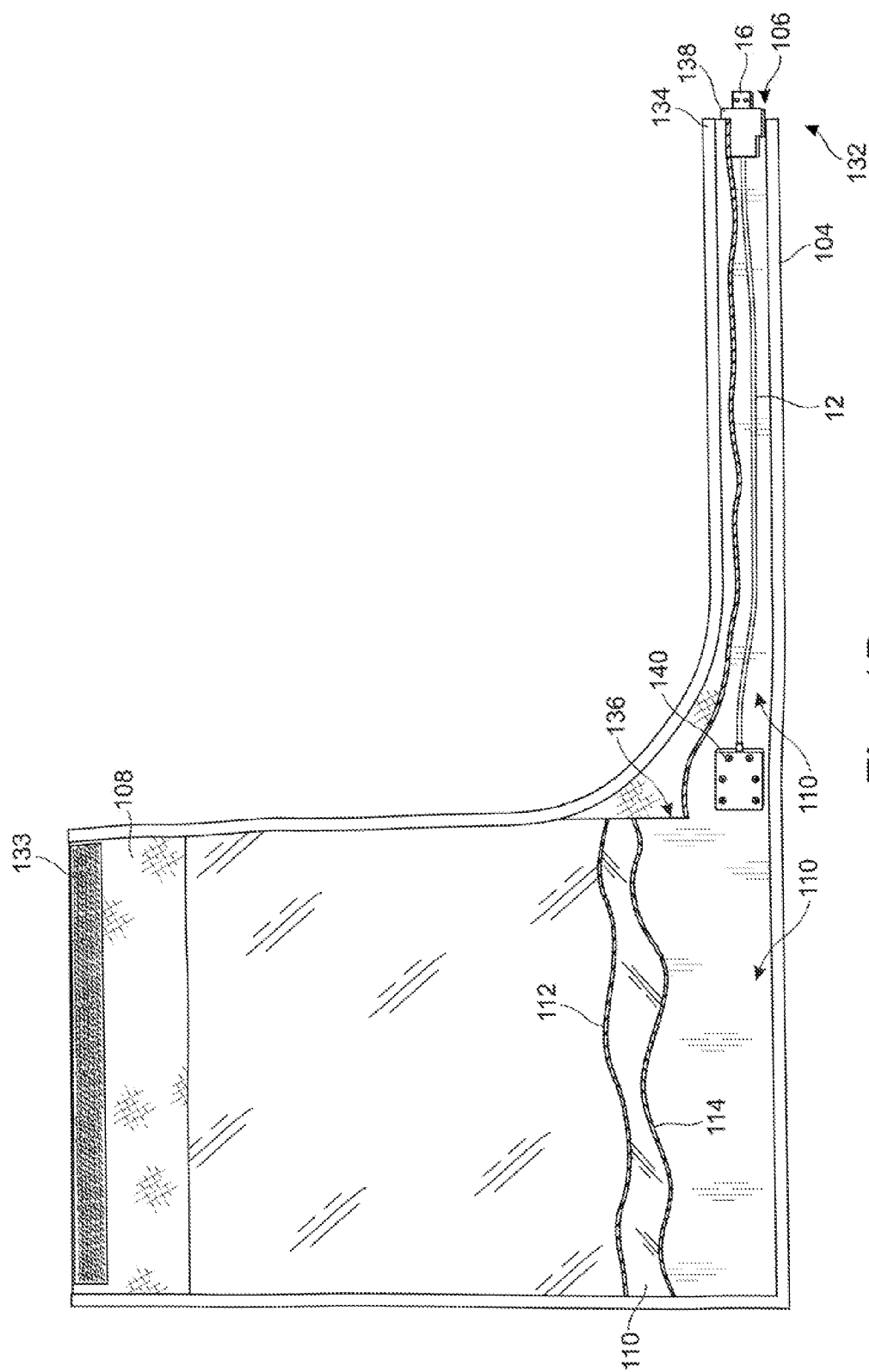
FIG. 1B is the EMI shield in FIG. 1A with a portion of the protective layer and the shielding layer lifted up and/or removed for clarity.

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

The present invention is a shielding device or EMI shield 100 to protect electronic devices 10 from electromagnetic interference, radiofrequency interference, and any other wireless signals (generally referred to as EMI) that may interfere with, modify, or otherwise, compromise information stored, received, or transmitted by an electronic device 10. The EMI shield 100 comprises a main enclosure 102 capable of fully covering or enclosing the electronic device 10. In some embodiments, the EMI shield 100 may further comprise a means for accessing and connecting to the electronic device with an auxiliary cable 12. For example, the means for accessing and connecting to the electronic device 10 with an auxiliary cable 12 may be a sleeve 104 connected to or integrally formed with the enclosure 102. The sleeve may have a hole 106 or tunnel through which the auxiliary cable 12 can be fed, or the hole 106 may be directly on the enclosure 102 itself.

The enclosure 102 provides the shielding effect to the electronic device 10. With reference to FIGS. 1A and 1B, the enclosure 102 may include an outer layer or protective layer 108 and an inner layer or shielding layer 110. The protective layer 108 provides protection to the electronic device 10 as well as the shielding layer 110. In some embodiments, the protective layer 108 may be made of a durable, but flexible material such as canvas, nylon, leather, and the like. In some embodiments, the protective layer 108 may be made of a more sturdy material such as foam. In some embodiments, the protective layer 108 may be made of a hard material such as metal or plastic. Therefore, in the embodiments utilizing sturdy or hard materials, the enclosure may have the appearance of a box or a clamshell container, whereas the flexible embodiments may be more like bags. However, the enclosure 102, whether flexible, sturdy, or hard, can take on any shape, such as round, oval, triangular, rectangular, and the like.

In some embodiments, the enclosure 102 is made up of a durable fabric protective layer 108, such as canvas having a generally rectangle shape with two opposing surfaces 111, 113 defined by four sides 116, 118, 120, 122 connected to each other to form four corners 124, 126, 128, 130. The protective layer 108 can be a single layer folded on top of itself and fastened at three of the four sides 118, 120, 122, with one side 116 remaining unfastened so as to define an opening 131. The open side 116 may comprise a fastening mechanism 133, such as a hook and loop fastener, zipper, adhesive, buttons, and the like so that the opening 131 can be closed. In some embodiments, a strip of the hook portion 133a may be on the first surface 111 along the length of the top side 116, and a strip of the loop portion 133b approximately the same length as the loop portion 133b may be on the second surface 113, but shifted towards the opposite side 120. The distance of the shift may be just over two widths of the strip so that when the strip of the hook portion 133a is folded over towards the second surface 113 twice, the strip of the hook portion 133a mates with the strip of the loop portion 133b. In some embodiments, the fastening mechanism 133 may be on the inner surface of the enclosure at the top side 116 so that the inner surfaces of the enclosure 102 are mated together. In some embodiments, the fastening mechanism 133 may be on the outer surface and the inner surface to provide a dual fastening system.

In some embodiments, two separate protective layers 108 may be fastened together at three sides 118, 120, 122 to form the enclosure having an opening 131 at one side 116.

The shielding layer 110 may comprise one or more layers of a metalized fabric, or other materials that can block EMI. The shielding layer 110 may have an opening that can be closed or opened to allow electronic devices to enter or exit the enclosure 102. Essentially, the shielding layer 110 lines the interior of the enclosure 102. In some embodiments, the shielding layer 110 may be loosely placed inside the enclosure 102. Therefore, the shielding layer 110 may simply be a pouch much like the enclosure 102, but slightly smaller to fit inside the enclosure 102. In some embodiments, the shielding layer 110 may be stitched, glued, or otherwise fastened to the inner side of the enclosure 102. In the preferred embodiment, to prevent any leaks or gaps in the shielding, the shielding layer 110 should be coextensive with the dimensions of the enclosure 102. In addition, the sealed sides 118, 120, 122 may be folded over and sealed to create an overlap of the shielding layer 110 at the sides 118, 120, 122 to prevent any gaps.

To allow the electronic device 10 to be previewed or operated, a portion of one surface 111 of the enclosure 102 may have a transparent portion or window 112. This window 112 may be comprised of a transparent protective layer made of a clear or see-through plastic, rubber, silicon, glass, and the like. In embodiments having a transparent window 112, the shielding layer 110 must also have a transparent window or transparent portion 114 overlapping with the transparent window 112 of the enclosure so that the transparent portion 114 permits the device 10 to be seen while the transparent window 112 provides a protective covering for the transparent portion 114 of the shielding layer 110. To create a portion of the shielding layer 110 that is transparent while still providing a shielding effect, the thread count of the metallized fabric of the shielding layer 110 may be lowered relative to an opaque shielding layer. The transparent window 112 or the transparent portion 114 does not necessarily have to be completely transparent so long as electronic device 10 is visible enough to operate while in the enclosure 102.

To permit access to the electronic device 10 while still in the enclosure 102, the enclosure may have a hole 106. In some embodiments, the hole 106 may be operatively connected to a hollow sleeve 104. The sleeve 104 may have the same construction as the enclosure 102, namely, the same or similar outer or protective layer 108 and the same or similar inner or shielding layer 110. An auxiliary cable 12 may be inserted through the sleeves 104 and/or the hole 106 to provide a means for connecting to the electronic device 10 inside the enclosure 102.

In the preferred embodiment, a sleeve 104 is operatively associated with the enclosure 102 at one side 118 of the enclosure 102, essentially forming an extension or protrusion of side 118 and/or an extended edge of one side 120 or corner 126 as shown in FIG. 1A. The sleeve 104 may be connected to the sides 118 or the enclosure 102 or the sleeve 104 may be integrally formed as a one-piece unit with the enclosure 102, extending away from the enclosure 102 and terminating at a free end 132. The sleeve 104 can be associated with an enclosure 102 having any other shape.

The free end 132 of the sleeve 104 may comprise a metallic unit 134 that may connect with the shielding layer 110 of metalized fabric as well as the protective layer 108 of material fabric. The metallic unit 134 at the free end 132 of the sleeve 104 is described in further detail below.

Figure 2A:
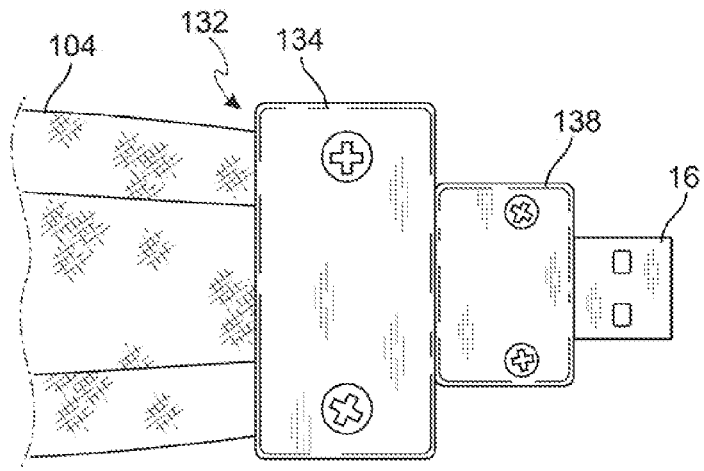
FIG. 2A is a view of the back side of the sleeve of an EMI enclosure according of the present invention, the sleeve terminating with a metallic unit that may connect with the inner layer(s) of metalized fabric as well as the outer layer(s) of protective fabric. The metallic unit may have a hole through it through which an auxiliary cable may protrude. As shown, a USB connection protrudes from the hole.
Figure 2B:
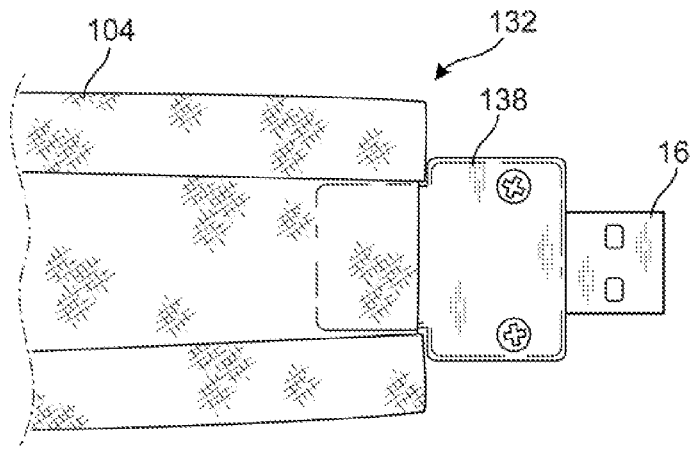
FIG. 2B is a view of the front side of the sleeve of an EMI enclosure according to the present invention with the metallic unit removed, the sleeve having a hole through which an end connection of an auxiliary cable protrudes. As shown, a USB connection protrudes from the hole.
Figure 2C:
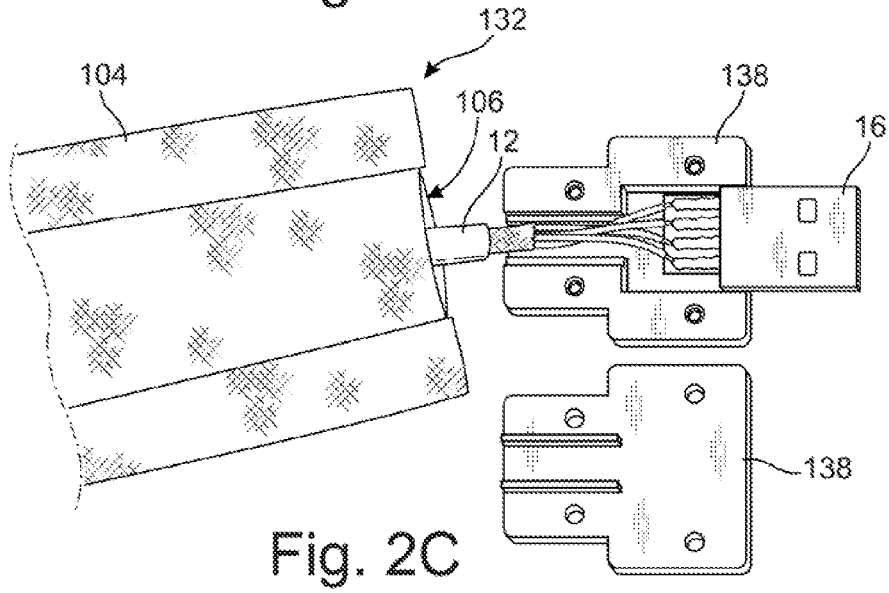
FIG. 2C is a view of the front side of the sleeve of an EMI enclosure according to the present invention with a portion of a connection removed for clarity of the internal structure, the sleeve having a hole through which an auxiliary cable may protrude. As shown, the auxiliary cable includes metalized shielding or an EMI filter which may be spliced at the end and connected with the metallic unit, which in turn contacts the entire EMI enclosure.
Figure 3A:
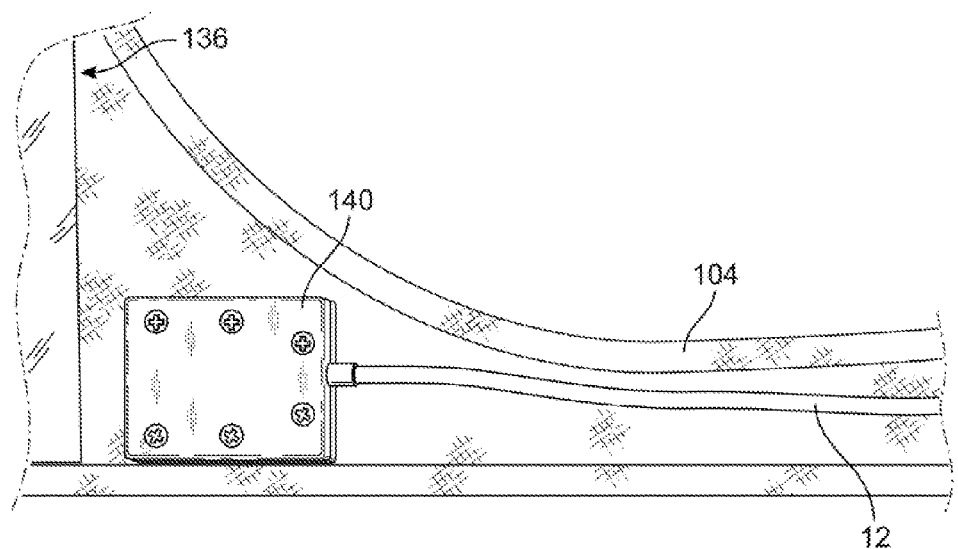
FIG. 3A is a view of the front side of a portion of the embodiment of the EMI enclosure according to the present invention showing the auxiliary cable and filter unit outside of the EMI enclosure.
Figure 3B:
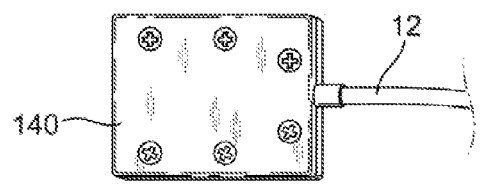
FIG. 3B is a view of the filter enclosure connected to an auxiliary cable that may be a component of the present invention.
Figure 3C:
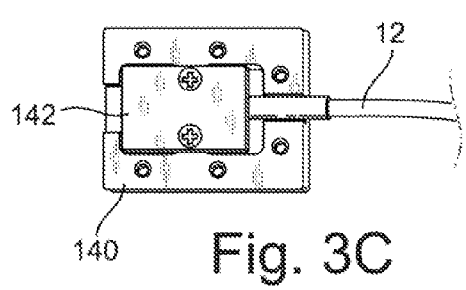
FIG. 3C is a view of the filter enclosure wherein the metallic portion of an auxiliary cable connection is mated to the filter enclosure in such a way that the device cable connection can become part of the complete EMI enclosure according to the present invention.

Cable connections may also be included in the EMI shield 100. As shown in FIGS. 2A-2C, the metallic unit 134 at the free end 132 of the sleeve 104 of the EMI enclosure 100 may include a hole 106 through which a cable-end connection 16 of an auxiliary cable 12 protrudes. In the example in FIGS. 2A-2C, a USB connection protrudes from the hole 106. The metallic portion of the cable-end 16 is mated to the metallic unit 134 in such a way that the cable-end 16 can become part of the complete EMI enclosure 100. The auxiliary cable 12 includes metalized shielding which may be spliced at the end and connected with the metallic unit 134, which in turn contacts the entire EMI enclosure. As shown in FIGS. 1B and 3A, the opposite end of the auxiliary cable 12 runs through the sleeve 104 towards the enclosure 102 and terminates at or near a junction 136 where the sleeve 104 transitions to the enclosure 102.

In some embodiments, a connection 138 protruding from the metallic unit 134 may be connected to the auxiliary cable 12 that is inside of the sleeve 104 of the enclosure 102. This auxiliary cable 12 includes metalized shielding which may be spliced at the end and connected with the connection 138, which in turn contacts the entire EMI enclosure. In such an embodiment, the metallic unit 134 may not be required.

In some embodiments, the auxiliary cable 12 may be configured with the aforementioned metallic unit 134 on one end, as well as a filter enclosure 140 on the opposite end. FIG. 3A shows the opposite end of the auxiliary cable 12 operatively connected to the filter enclosure 140 on the outside of the sleeve 104. The filter enclosure 140 serves as a protective covering for an EMI filter 142.

Figure 3D:
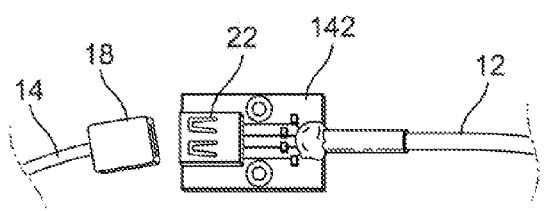
FIG. 3D is a view of small EMI filter that may be placed in between the end connection of a device cable and an auxiliary cable that runs inside of the sleeve of the enclosure according to the present invention.

As shown in FIGS. 3A-3D, a small EMI filter 142 having a connector portion 22 may be placed in between a connector end 18 of the device cable 14 and the auxiliary cable 12 that runs inside of the sleeve 104, to prevent the auxiliary cable 12 from transmitting outside signal to the electronic device 10 inside of the EMI shield 100. The EMI filter 142 may be encased in a filter enclosure 140 that touches the shielding layer 110 of metalized fabric of the enclosure 102. The filter enclosure 140 may be made of metal. The filter enclosure 140 may be connectable with the opposite end of the auxiliary cable 12 that is not already connected to the metallic unit 134. Although FIG. 3D shows the auxiliary cable 12 soldered to the EMI filter 142, the connection may also be removable, by adding another connector portion 24, such as a USB connector, so that the auxiliary cable 12 can be removably connected to the EMI filter 142 as shown in FIG. 4D.

The connector portion 18 of the device cable 14 is mated to the filter enclosure 140 in such a way that the cable connections can become part of the complete EMI shield 100. The connector portion 20 of the device cable 14 opposite connector portion 18 can be connected to the electronic device 10 inside the enclosure 102. Since these connections occur inside of the EMI enclosure 102 the shielding is maintained. The auxiliary cable 12 that extends from the filter enclosure 140 is also connected to the metallic unit 134 on the free end 132 of the sleeve 104. This metallic unit 134 has a cable end-connection 16 which is external to the EMI enclosure 102 and sleeve 104 and can be inserted into another device. This configuration allows the electronic device 10 placed inside of the EMI shield 100 to connect with devices outside of the EMI shield 100 while remaining shielded from EMI signals.

Figure 4A:
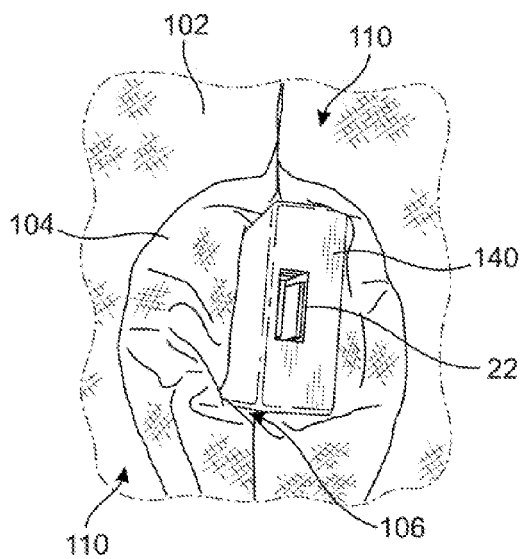
FIG. 4A is a view of the inside of the main enclosure showing a filter enclosure according to the present invention.
Figure 4B:
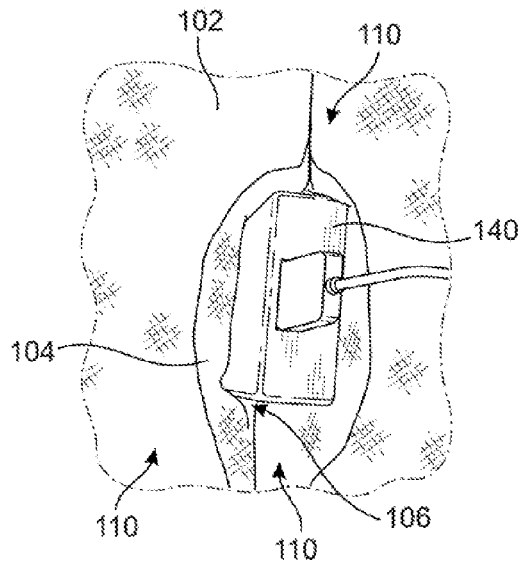
FIG. 4B is the view of FIG. 4A with a device cable connected to the filter enclosure.
Figure 4C:
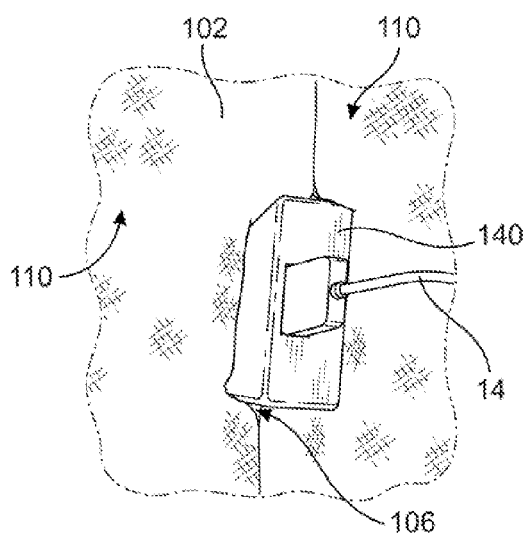
FIG. 4C is a view of another embodiment of the inside of the main enclosure showing a filter enclosure protruding from a hole without a sleeve.
Figure 4D:
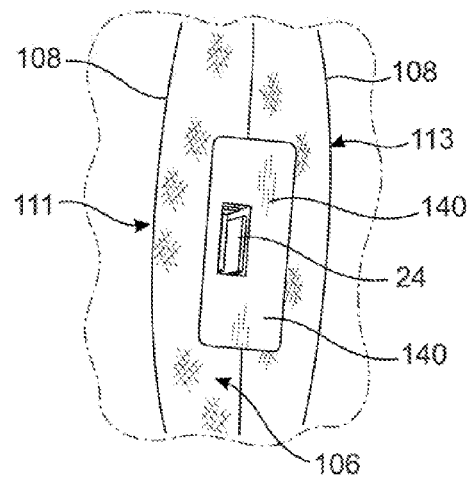
FIG. 4D is a view of the opposite end shown in FIG. 4C of the main enclosure from the outside of the main enclosure.
Figure 4E:
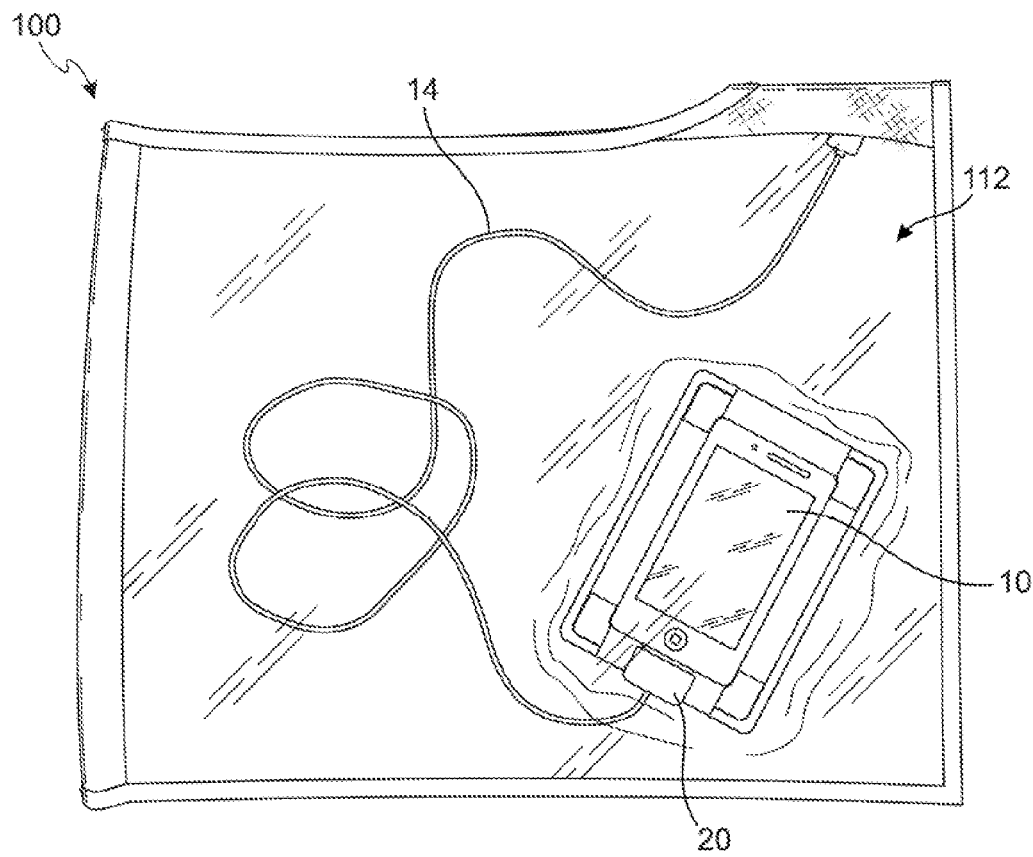
FIG. 4E is a view of the EMI shielding enclosure showing a side with a transparent window, allowing preview of the contents of the enclosure.

As shown in FIGS. 3A and 4A-4D, in the preferred embodiment, the EMI filter 142 and filter enclosure 140 are positioned at the junction 136 where the sleeve 104 transitions to the main enclosure 102. In embodiments without the sleeve 104 the EMI filter 142 and filter enclosure 140 would be at the hole 106 of the main enclosure. Therefore, the filter enclosure 140 and/or the EMI filter 142 itself may be fastened to the main enclosure 102 at the hole 106 with adhesives or other fastening methods so as to effectively seal the hole 106 as shown in FIGS. 4C and 4D. In such an embodiment, the EMI filter 142 may have two connector portions 22, 24 at each end instead of one. This allows the auxiliary cable 12 to be removable from the EMI filter 142. Therefore, a device 10 in the main enclosure will still be able to communicate or transmit data to an external device through an auxiliary cable 12 without a sleeve 104.

Manual operation of touchscreen devices inside of an EMI shield has been difficult or impossible. One problem is that the electronic device 10 cannot be seen when inside the enclosure 102. Another problem is that the user cannot touch the touchscreen 20 because it is inside the enclosure 102. A third problem is that when utilizing a flexible material for the transparent windows 112, 114, the transparent portion 114 of the shielding layer 110 will make contact with the touchscreen 20 and possibly cause interference with actuation of the touchscreen 20. Therefore, a means for operating the electronic device from outside the enclosure and a means for preventing the shielding layer 110 from touching the touchscreen 20 of the electronic device 10 may be required. The visibility of the electronic device 10 has been obviated by the transparent windows 112 and 114. A means for operating the electronic device from outside the enclosure and a means for preventing the shielding layer 110 from touching the touchscreen 20 of the electronic device 10 is described below.

Figure 5:
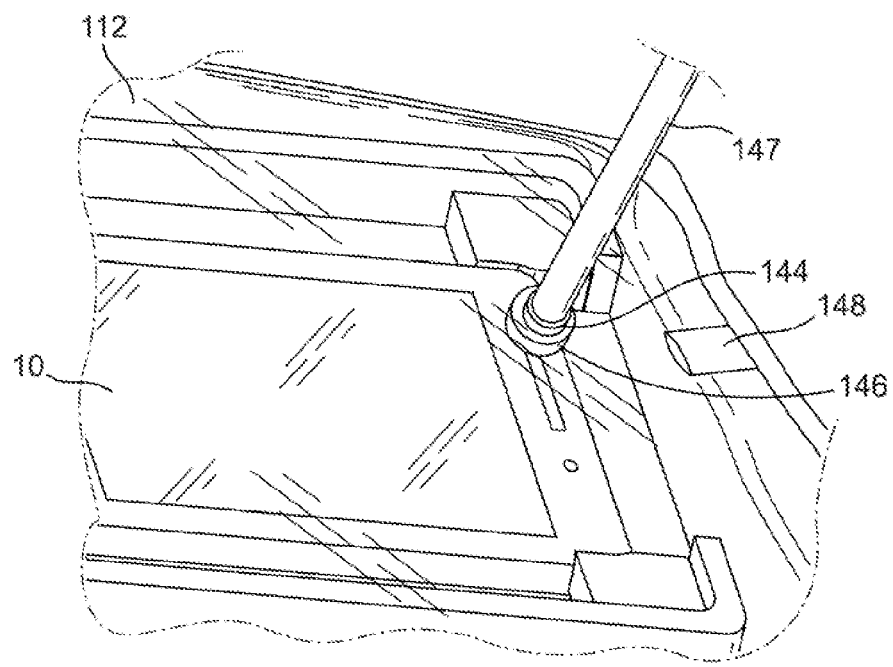
FIG. 5 is a view of an embodiment of the EMI shield of the present invention showing an inner magnet and a stylus with a magnet on the end allowing a user to contact the touchscreen and activate it.

In some embodiments, a means for operating the electronic device 10 from outside the enclosure may be provided, particularly where the electronic device 10 utilizes a touchscreen 20 as a method of input. For example, as shown in FIG. 5, one means for operating the electronic device 10 from outside the enclosure 102 utilizes a magnet system. The magnet system may comprise an external magnet 144 used on the outside of the enclosure 102 and an internal magnet 146 used on the inside of the enclosure 102. The external magnet 144 may be used by the user to control movement of the internal magnet 146 from outside the enclosure 102. The internal magnet 146 makes contact with the electronic device 10, particularly the touchscreen 20, and mimics a user's finger to actuate the touchscreen 20. The internal magnet 146 is placed inside of the EMI enclosure 102 before it is sealed.

To facilitate movement of the external magnet 144, the external magnet 144 may be fixed to an elongated magnet holder 147. The elongated magnet holder 147 may be a pencil or pen-like device, such as a stylus. Using the stylus, with an external magnet 144 on the end, like a pen, the user can move along the outside of the transparent window 112 near the internal magnet 146 inside of the enclosure 102 to connect with the internal magnet 146. Once the two magnets 144, 146 are connected, with the transparent windows 112, 114 between the two magnets 144, 146, the internal magnet 146 can be manipulated by the external magnet 144, which is connected to the stylus. The internal magnet 146, which is of a size suitable for emulating finger touch, contacts the touchscreen 20 and activates it. For example, the inner magnet 146 may be a disk magnet. In the preferred embodiment, the inner magnet 146 has a diameter of approximately 0.25 to approximately 0.5 inch and a thickness of 0.125 inch. Most preferably, the inner magnet 146 has a diameter of approximately 0.375 inch. The shape and configuration also allows the inner magnet 146 to depress buttons on the electronic device 10. The inner magnet 146 should also have smooth edges so as not to damage the electronic device 10 or the shielding layer 110. Because hard drives use rare-earth magnets, the inner magnet 146 should not affect the hard drives.

Preferably, the external magnet 144 of the elongated holder 147 is a spherical magnet with the pole aligned so that it is generally parallel with to the elongated holder 147. The external magnet 144 may be, for example, 0.25 inch in diameter. Preferably, both magnets are nickel plated neodymium magnets.

In some embodiments, a pocket 148 may be created on the transparent portion 114 of the shielding layer 110 or some other portion of the shielding layer 110 so that the internal magnet 146 can be "parked" or stored when not in use without interfering with the touchscreen 20. The pocket 148 should be created on the side of the shielding layer 110 adjacent to the device 10. However, the pocket 148 may be created in between the shielding layer 110 and the protective layer 108.

Figure 6A:
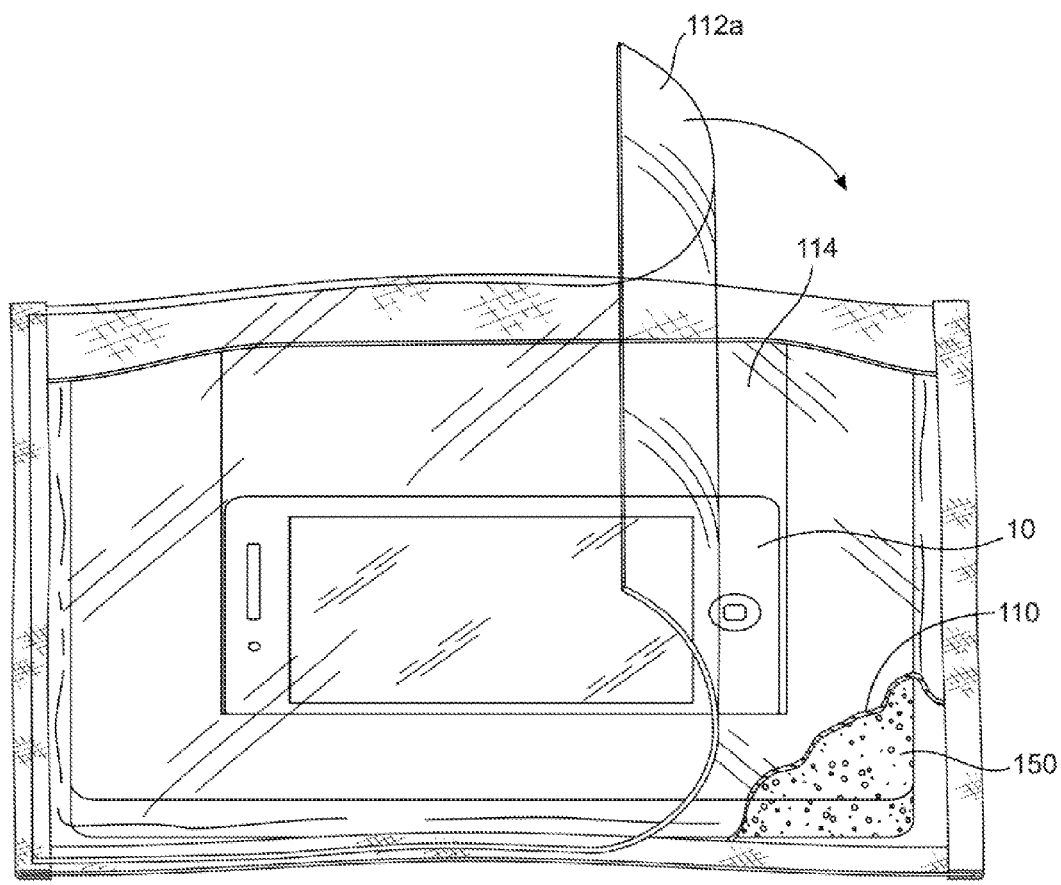
FIG. 6A is another embodiment of the enclosure in the closed configuration.

To further facilitate operating the device 10 in the enclosure 102, the covering 112a for the transparent portion 114 may be removable or separable from the transparent portion 114 as shown in FIG. 6A. For example, the covering 112a may be fastened to one of the sides 116, 118, 120, or 122 of the enclosure 102. This allows the covering 112a the lift up off of the surface of the transparent portion 114 of the shielding layer 110. By removing the covering 112a off of the transparent portion 114 of the shielding layer 110, actuation of the electronic device 10 may be improved. In such an embodiment, the covering 112a does not necessarily have to be a transparent window. Thus, covering 112a can be opaque.

A means for preventing the shielding layer 110 from touching the touchscreen 20 of the electronic device 10 may be one or more firm, rigid, or semi-rigid structural supports 150 to separate the shielding layer 110 from the electronic device 10 and/or the touchscreen 20. Firm and rigid generally means that the structure can maintain its shape, structure, or configuration in its natural state regardless of how it is held or positioned. For example, a sufficiently thick piece of foam, plastic, rubber, metal, wood, and the like will maintain their same shape, structure, or configuration regardless of how they are positioned or held, whereas a rectangular piece of fabric would bend when held at the corner and suspended in the air.

The structural support 150, for example, may be a piece of foam, rubber, plastic, metal, wood, glass, and the like. In the preferred embodiment, the support 150 is made of foam, rubber, or some other firm material that provides some cushioning effect. This prevents the enclosure 102 from making contact with the screen of the electronic device 10. In addition, the support 150 prevents the means for operating the electronic device from unintentionally operating the electronic device 10. Finally, utilizing foam reduces the chance that the enclosure 102 or the electronic device 10 will be damaged since the foam is lightweight and flexible.

Figure 6B:
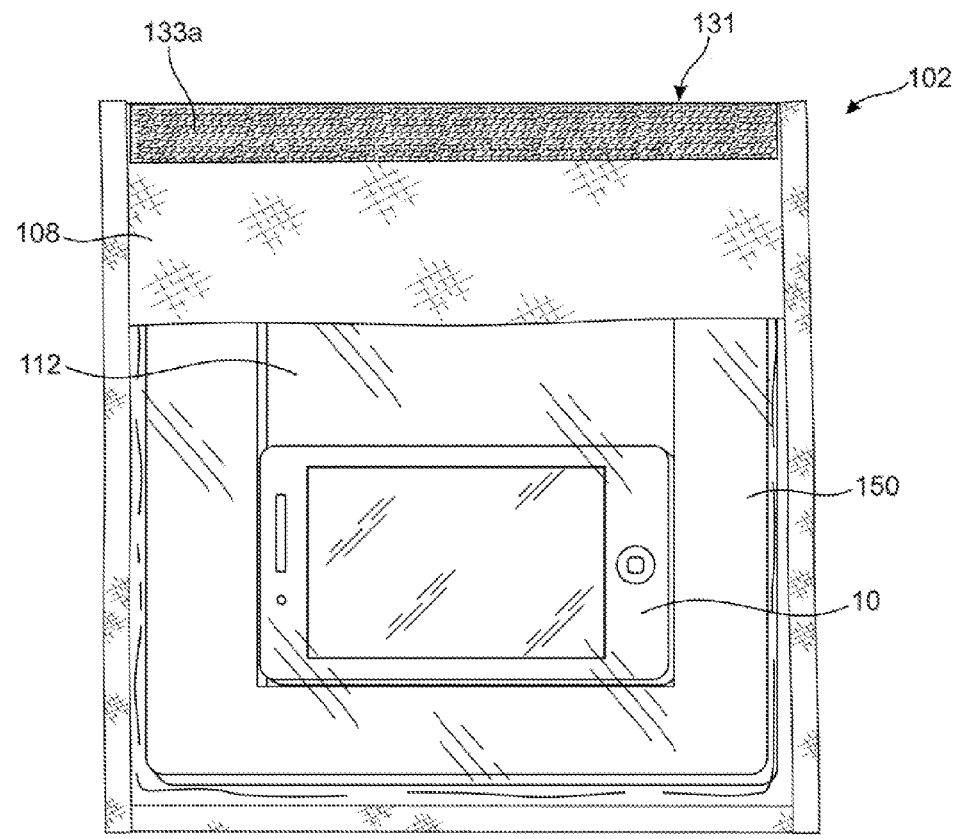
FIG. 6B is the enclosure of FIG. 6A in a partially closed figuration.
Figure 6C:
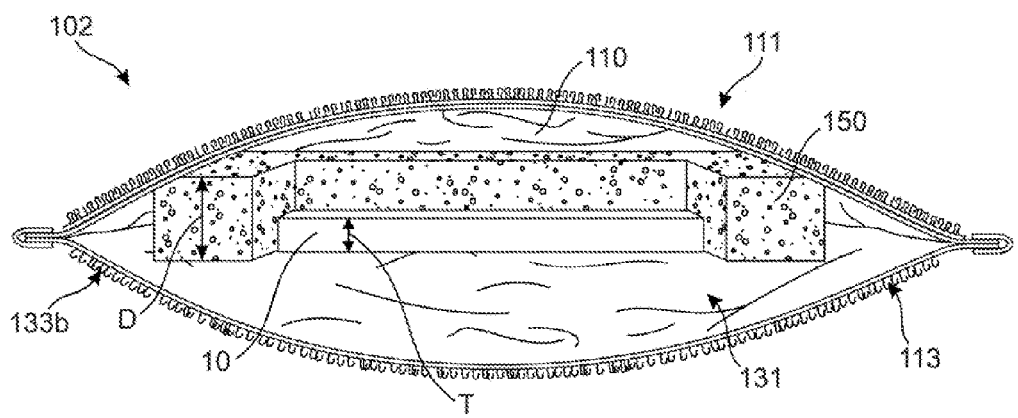
FIG. 6C is the embodiment of the enclosure shown in FIG. 6B in the open configuration.

In some embodiments, the support 150 may be a flexible material having a filling that provides structural firmness or rigidity. For example, the support 150 may be a plastic bag filled with air or water and sealed airtight. The structural support 150 can take on any shape so long as one overall dimension of the support 150, i.e. the height or cross-sectional diameter, is greater than the thickness T of the electronic device 10. For example, the support 150 may be the shape of a block, a ball, a pyramid, a dome, a cylinder, and the like. In the preferred embodiment, the support 150 may be an elongated structure having a round, oval, square, rectangular, triangular, star-shaped, or any other shaped cross-sectional area, wherein one dimension D of the cross-sectional area is greater than the thickness T of the electronic device 10. Therefore, as shown in FIGS. 6B and 6C, when the electronic device 10 is laid flat in the enclosure 102, the support 150 extends upwardly beyond the top surface or touchscreen of the electronic device 10. Due to the firmness or rigidity of the support 150, the support 150 pushes the shielding layer 110 away from the electronic device 10.

One or more structural supports 150 may be used. Preferably, multiple structural supports 150 may be placed inside the enclosure 102 in strategic locations, for example, along one or more of the sides 116, 118, 120, 122, as shown in FIGS. 6A and 6B. The electronic device 10 may be placed in between these supports 150. The supports 150 can be independent or individual pieces that can be inserted and removed from the enclosure 102. In some embodiments, supports 150 may be connectable to the enclosure 102, for example, with hook and loop fasteners, adhesives, and the like. In some embodiments, the supports 150 may be integrally formed with the enclosure 102.

Figure 7:
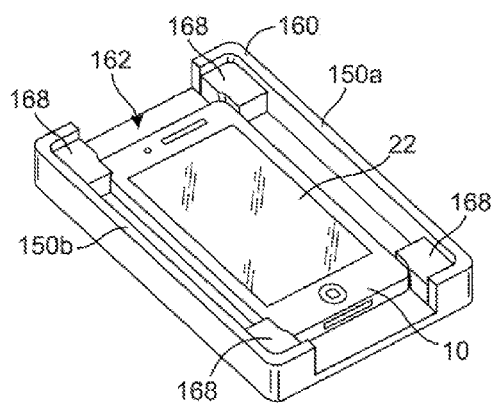
FIG. 7 is a view of a cradle for holding and receiving a touchscreen device inside of an EMI enclosure according to the present invention that prevents the metalized fabric from resting on the touchscreen of the device inside.
Figure 8:
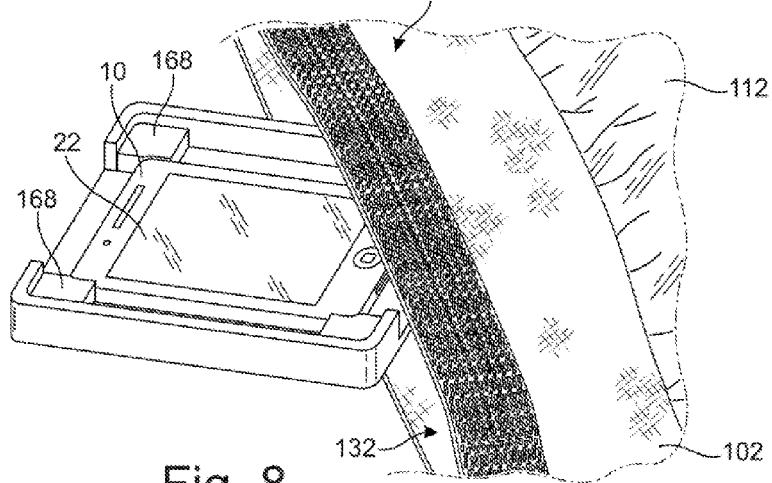
FIG. 8 is a view of the EMI shielding enclosure according to the present invention that shows an opening that can be closed or opened to allow devices to enter or exit the enclosure.

In some embodiments, multiple supports 150a, 150b may be arranged together to form a cradle 160 as shown in FIG. 7. The cradle 160 may be a rigid or semi rigid support having a cavity 162 that receives the electronic device 10. The cavity 162 may be defined by supports 150a, 150b of the cradle 160 that have a height that is greater than the thickness T of the electronic device 10. Therefore, when the electronic device 10 is laid flat in the cavity 162 of the cradle 160, the supports 150a, 150b extend upwardly beyond the top surface or touchscreen of the electronic device 10. The cradle 160 containing the electronic device 10 can be inserted into the enclosure 102. Due to the rigidity of the supports 150a, 150b, the shielding layer 110 is pushed away from the electronic device 10, like that shown in FIG. 6C. Bumpers 168 may be used to secure the electronic device 10 inside the cavity 162 by creating a resistance fit between the electronic device 10 and the supports 150a, 150b of the cradle 160, thereby providing added protection to the electronic device 10. Bumpers 168 may come in a variety of sizes that accommodate devices 10 of varying sizes.

The cradle 160 can be constructed in a variety of ways. For example, the cradle 160 may be constructed from foam, plastic, rubber, wood, glass, metal and the like. The cradle 160 can be a one-piece molded construct. Alternatively, the cradle 160 can be made of multiple pieces connected together.

Figure 9:
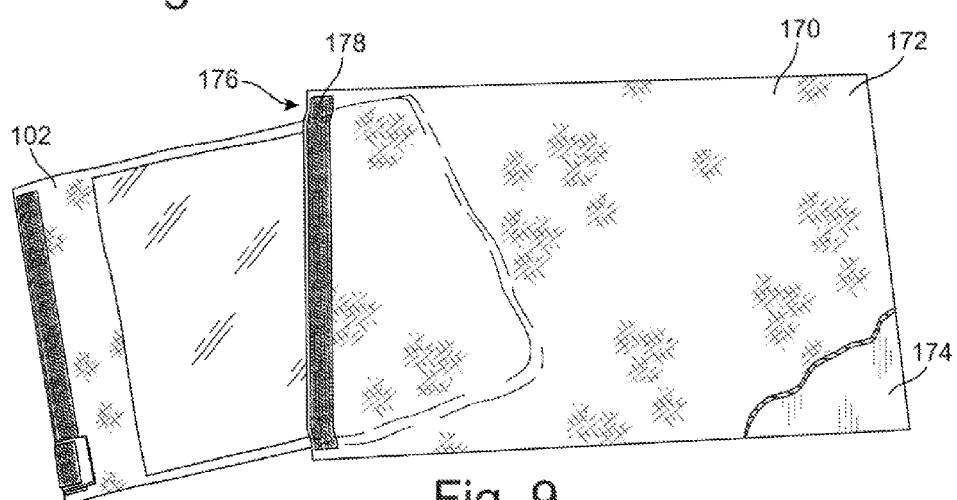
FIG. 9 is a perspective view of an optional secondary EMI enclosure without a preview window in which an EMI enclosure according to the present invention may be placed, the EMI enclosure shown partially placed inside the secondary EMI enclosure.

For additional shielding, the EMI enclosure 102 can be placed inside of a secondary EMI enclosure 170 that may or may not have a transparent window (for example, for transport of the device 10 when it may encounter strong EMI signals from signal towers nearby) as shown in FIG. 9. Like enclosure 102, the secondary enclosure 170 has the same or similar protective layer 172 on the outside, preferably made of canvas or another durable material, and a shielding layer 174 of metalized fabric on the inside. Shielding layer 174 of the secondary enclosure 170 may be opaque and does not require a transparent window. One side of the secondary enclosure 170 is an opening 176 in which devices can enter or exit the secondary enclosure 170. The side with the opening 176 may comprise a closure system 178, such as a zipper, hook and loop fasteners, adhesives, buttons, and the like, similar to the main enclosure 102. When the opening 176 is closed, the secondary enclosure 170 is a fully sealed EMI enclosure without a preview window.

Figure 10:
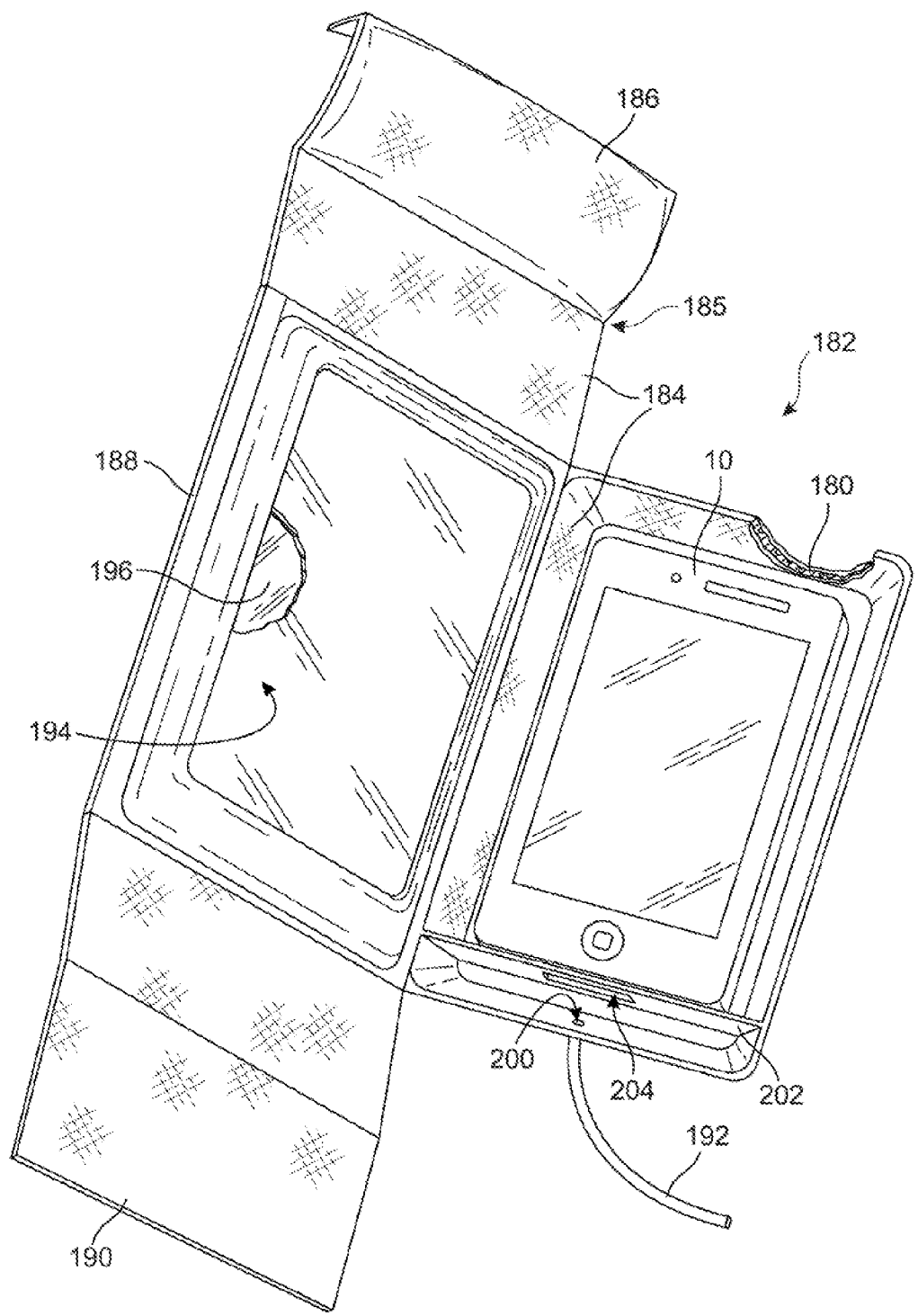
FIG. 10 is a perspective view of another embodiment of the present invention with portions cut away to show various features.

In some embodiments, as shown in FIG. 10, rather than utilizing a flexible fabric material for the enclosure 102, a firm, rigid, or semi-rigid substrate 180 may be used. By way of example only, the substrate 180 may be made from a foam plastic. However, any other firm, rigid, or semi-rigid material can be used, such as wood, glass, metal, rubber, and the like. In the preferred embodiment, the substrate 180 may be a foam plastic laminated to a conductive or metallic fabric 184 and molded into the enclosure 182, having a construction design that allows for the overlap 185 of conductive fabric 184 at the seams and other, non-integral portions of the enclosure construction, such that when the enclosure 182 is closed properly it creates a signal-shielding 'faraday cage.'

The edges 186, 188, 190 of the laminated material 184 overlap to form a continuous metallic surface around the contents of the enclosure 182, effectively shielding devices and other contents inside of the enclosure 182 from incoming signals and preventing signals from the devices inside the enclosure 182 from escaping the enclosure 182.

In addition to creating an aesthetically pleasing surface, this construction produces a more durable conductive surface than conductive fabric alone due to the support of the laminated substrate 180. The laminated substrate 180 can be molded using heat and or compression to form the enclosure 182 which with appropriate design and overlapping seams, to eliminate the need to sew the conductive material 184, which can potentially damage it or weaken the protective property. In addition, the foam substrate enclosure 182 has many additional benefits such as allowing for joints or junctions 192 to be easily fastened to the enclosure 182 through an orifice 200 with overlapping fabric which will maintain the faraday integrity of the enclosure 182 while providing electricity or data between a device inside of the enclosure 182 and a device (such as a battery or a computer) outside of the enclosure without compromising the faraday shielding property of the enclosure. In some embodiments, a dividing wall 202 may be provided to create a second compartment to house batteries, cables, or other devices within the enclosure 182. The dividing wall 202 may have a slit or opening 204 through which cables and the like can be inserted to connect with the device.

The foam substrate 180 also provides a level of physical protection against bumping or crushing the devices 10 inside of the enclosure 182 that current faraday bags do not. The semi-rigid nature of the enclosure 182 is lighter and more flexible than current metal boxes used to provide faraday shielding while providing more structure and form, and protection to enclose devices 10 than bags which are currently manufactured out of conductive material for such purposes. An additional benefit to the fabric-plastic laminate construction is that the formed foam substrate can suspend the conductive fabric on the inside of the enclosure 182 minimizing the contact of the fabric 184 to touch-screen surfaces 20 of devices 10 inside the enclosure 182. The suspension of the conductive fabric 184 off of the device 10 can allow making for better operation of a touchscreen 20 inside of the enclosure 182 by means of either pressing through the semi-rigid enclosure 182 with a finger or by the use of a stylus inside of the enclosure 182 (manipulated with a magnet) without need of any additional frame or cradle inside the bag to suspend the fabric. A transparent or semi-transparent conductive fabric 194 can be laminated to a transparent substrate (plastic or glass) material 196 to create a viewable window that, when properly installed with overlapping conductive fabric 194 at its seems will allow a device 10 to be viewed and manipulated within the enclosure 182 while maintaining an effective continuous faraday shield.

These features should be considered novel when used in any combination or order. The following describes possible uses of the present invention.

In one aspect, a portable wireless device 10 is seized, and device cable 14 is connected to portable wireless device 10, and the other end of the device cable 14 already connected to portable wireless device is connected to filter box 140 as shown in FIG. 4B. Then, a portable wireless device 10 is placed inside of EMI enclosure 102 and the EMI enclosure 102 is placed inside of transport bag 172. The EMI enclosure 102 is removed from the transport bag 172, and a metallic unit 134 is inserted into data acquisition or charging device. As a result, the device 10 inside of EMI enclosure 102 interacts with external acquisition or charging device through cable connection.

In another aspect, a portable touchscreen wireless device 10 is seized, and the portable touchscreen wireless device 10 is placed inside of cradle 160. Then, a device cable 14 is connected to portable wireless device and the other end of the device cable 14 is connected to filter box 140. The portable wireless device 10 is placed inside of the EMI enclosure 102, and the EMI enclosure 102 is placed inside of transport bag 172. Next, the EMI enclosure 102 is removed from transport bag 172, a metallic unit 134 is inserted into data acquisition or charging device, and the device 10 inside of EMI enclosure 102 interacts with external acquisition or charging device through cable connection. The device 10 inside of EMI enclosure 102 can be human-operated by system of magnets 144, 146 and stylus 147.

In another aspect, a portable touchscreen wireless device 10 is seized and the portable touchscreen wireless device 10 is placed inside of cradle 160. A cable 14 is connected to the portable wireless device 10, and the other end of cable is connected to filter box 140. The portable wireless device 10 is placed inside of the EMI enclosure 102 and a metallic unit 134 is inserted into data acquisition or charging device. The device 10 inside of the EMI enclosure 102 interacts with external acquisition or charging device through cable connection, and the device inside of EMI enclosure can be human-operated by system of magnets 144, 146 and stylus 147.

While the present invention has been described with regards to particular embodiments, it is recognized that additional variations of the present invention may be devised without departing from the inventive concept.

INDUSTRIAL APPLICABILITY

This invention may be industrially applied to the development, manufacture, and use of EMI enclosures, and more specifically relates to portable EMI enclosures for use in shielding electronics from EMI and wireless communication signals.

What is claimed is:

1. An electromagnetic interference (EMI) shield, comprising:
   (a) a main enclosure to shield an electronic device from electromagnetic interference, the enclosure, comprising:
      (i) a protective layer having a transparent window,
      (ii) a shielding layer having a transparent portion overlapping the transparent window, and
      (iii) an opening to receive the electronic device, and
      (iv) an orifice through which a device cable connectable to the electronic device can exit;
   (b) a sleeve having a first end and a second end opposite the first end, the first end of the sleeve operatively associated with the enclosure for accessing and connecting to the electronic device while the electronic device is inside the enclosure, without compromising shielding from the electromagnetic interference, the sleeve, comprising:
      (i) an inner layer for shielding;
      (ii) an auxiliary cable housed inside the sleeve, the auxiliary cable, comprising a first cable-end connection at a first end and a second cable-end connection at a second end;
      (iii) a metallic unit fastened to the second end of the sleeve, the metallic unit mated with the second cable-end connection; and
      (iv) an EMI filter connected to the first cable-end connection, wherein the first cable-end connector is connectable to the device cable.

2. The EMI shield of claim 1, further comprising a magnet system to operate the electronic device while shielded.

3. An electromagnetic interference (EMI) shield, comprising:
   (a) a main enclosure comprising a shielding layer to shield an electronic device from electromagnetic interference;
   (b) a sleeve having a first end and a second end opposite the first end, the first end of the sleeve operatively associated with the enclosure for accessing and connecting to the electronic device while the electronic device is inside the enclosure, without compromising shielding from the electromagnetic interference; and
   (c) a means for operating the electronic device while inside the main enclosure, wherein the means for operating the electronic device, comprises:
      (i) an internal magnet housed inside the enclosure, and
      (ii) an elongated holder having an external magnet at one end to interact with the internal magnet.

4. The EMI shield of claim 3, wherein the enclosure further comprises an interior pocket to house the inner magnet when not in use.

5. The EMI shield of claim 3, further comprising a support to separate the shielding layer from the electronic device.

6. The EMI shield of claim 3, wherein the shielding layer comprises a transparent window.

7. The EMI shield of claim 6, further comprising a covering over the transparent window.

8. The EMI shield of claim 3, further comprising a second enclosure configured to receive the main enclosure.

9. The EMI shield of claim 3, wherein the second end of the sleeve comprises a metallic unit to completely shield an auxiliary cable connectable to the device cable.

10. The EMI shield of claim 9, further comprising an EMI filter positioned at the first end of the sleeve, the EMI filter connecting the device cable to the auxiliary cable.

11. An electromagnetic interference (EMI) shield, comprising an enclosure to shield an electronic device from electromagnetic interference, the enclosure comprising:
   (a) an outer layer;
   (b) an inner layer enveloped by the outer layer;
   (c) an opening to receive the electronic device;
   (d) a hole through which the electronic device can transmit data to an external device;
   (e) an internal magnet housed inside the enclosure; and
   (f) an elongated holder having an external magnet at one end to interact with the internal magnet.

12. The EMI shield of claim 11, wherein the enclosure further comprises an interior pocket to house the inner magnet when not in use.

13. The EMI shield of claim 11, wherein the inner layer a comprises a transparent portion to view the electronic device inside.

14. The EMI shield of claim 13, further comprising a covering over the transparent portion.

15. The EMI shield of claim 14, wherein the covering is separable from the transparent portion.

16. The EMI shield of claim 11, wherein the outer layer is rigid, box-like configuration.

17. The EMI shield of claim 16, wherein the inner layer is laminated onto the outer layer.

18. The EMI shield of claim 11, wherein the hole is sealed by an EMI filter having a connector portion to connect to an auxiliary cable.

* * * * *